United States Patent [19]

Steiner et al.

[11] Patent Number: 4,815,021

[45] Date of Patent: Mar. 21, 1989

[54] MULTIFUNCTION ARITHMETIC LOGIC UNIT CIRCUIT

[75] Inventors: Walter R. Steiner, Ormond Beach; Paul A. Simoncic, Daytona Beach, both of Fla.

[73] Assignee: Star Technologies, Inc., Sterling, Va.

[21] Appl. No.: 824,053

[22] Filed: Jan. 30, 1986

[51] Int. Cl.[4] ............................................. G06F 7/38
[52] U.S. Cl. ..................................... 364/716; 364/736
[58] Field of Search ........ 364/716, 748, 768, 784–785, 364/736; 340/146.2, 347 DD; 307/465; 235/310–311

[56] References Cited

U.S. PATENT DOCUMENTS

| | | | |
|---|---|---|---|
| 4,417,314 | 11/1983 | Best | 364/716 |
| 4,454,589 | 6/1984 | Miller | 364/716 |
| 4,475,237 | 10/1984 | Glasby | 340/146.2 |
| 4,524,345 | 6/1985 | Sybel et al. | 340/146.2 |
| 4,620,292 | 10/1986 | Hagiwara et al. | 364/748 |
| 4,631,696 | 12/1986 | Sakamoto | 364/748 |

Primary Examiner—Gary V. Harkcom
Assistant Examiner—Long T. Nguyen
Attorney, Agent, or Firm—Spensley Horn Jubas & Lubitz

[57] ABSTRACT

A multifunction arithmetic logic circuit having comparison and numeric conversion circuitry, particularly adapted for use in graphics processing. The inventive architecture comprises a modular arithmetic logic unit in a pipelined architecture circuit. Functions performed are conversion of floating point numbers to fixed point numbers, and vise versa, arithmetic and logical operations, and numeric comparison operations. A visibility logic subcircuit is included for rapidly tracking numeric comparisons to indicate whether a graphics object is to be considered visible, partially visible, or invisible.

27 Claims, 5 Drawing Sheets

MULTIFUNCTION ARITHMETIC LOGIC UNIT CIRCUIT

BACKGROUND OF THE INVENTION

1. Field of the Invention

This invention relates to electronic computation circuits, and more particularly to a multifunction arithmetic logic circuit having comparison and numeric conversion circuitry.

2. Background Information

In many high speed electronic systems, such as graphic processing systems, a large number of mathematical calculations must be performed. For high speed electronic systems, time is of the essence in performing such calculations. Therefore, it is desirable to have a dedicated circuit that can perform such mathematical functions at a very high rate of speed. In the graphics area, it is particularly desirable to have such a circuit that can perform calculations on floating point numbers, fixed point numbers, and logical data. It is also desirable to be able to convert floating point numbers to fixed point numbers, and vice versa. It is further desirable to be able to compare the values of two numbers, and to be able to track changes in the value of a string of such comparisons for purposes of determining whether an object in a graphics environment is to be displayed. In the prior art, some of these functions have been performed by a dedicated integrated circuit. A typical circuit is the Weitek Corporation WTL 1033 Arithmetic Logic Unit. However, the known prior art integrated logic circuits are not optimized for use in a graphics processing system, and do not include many desirable functions.

Therefore, it is an object of the present invention to provide a high speed pipelined architecture arithmetic logic circuit having a number conversion subcircuit, a number comparison subcircuit, and a visibility logic subcircuit particularly useful in a graphics processor. The invention is described in the context of an integrated circuit capable of performing such calculations in 300 nanoseconds, with a throughput rate of 100 nanoseconds at a clock frequency of 10 MHz.

DESCRIPTION OF THE DRAWINGS

Like reference numbers and names in the various figures refer to like elements.

SUMMARY OF THE INVENTION

Figure 1A:
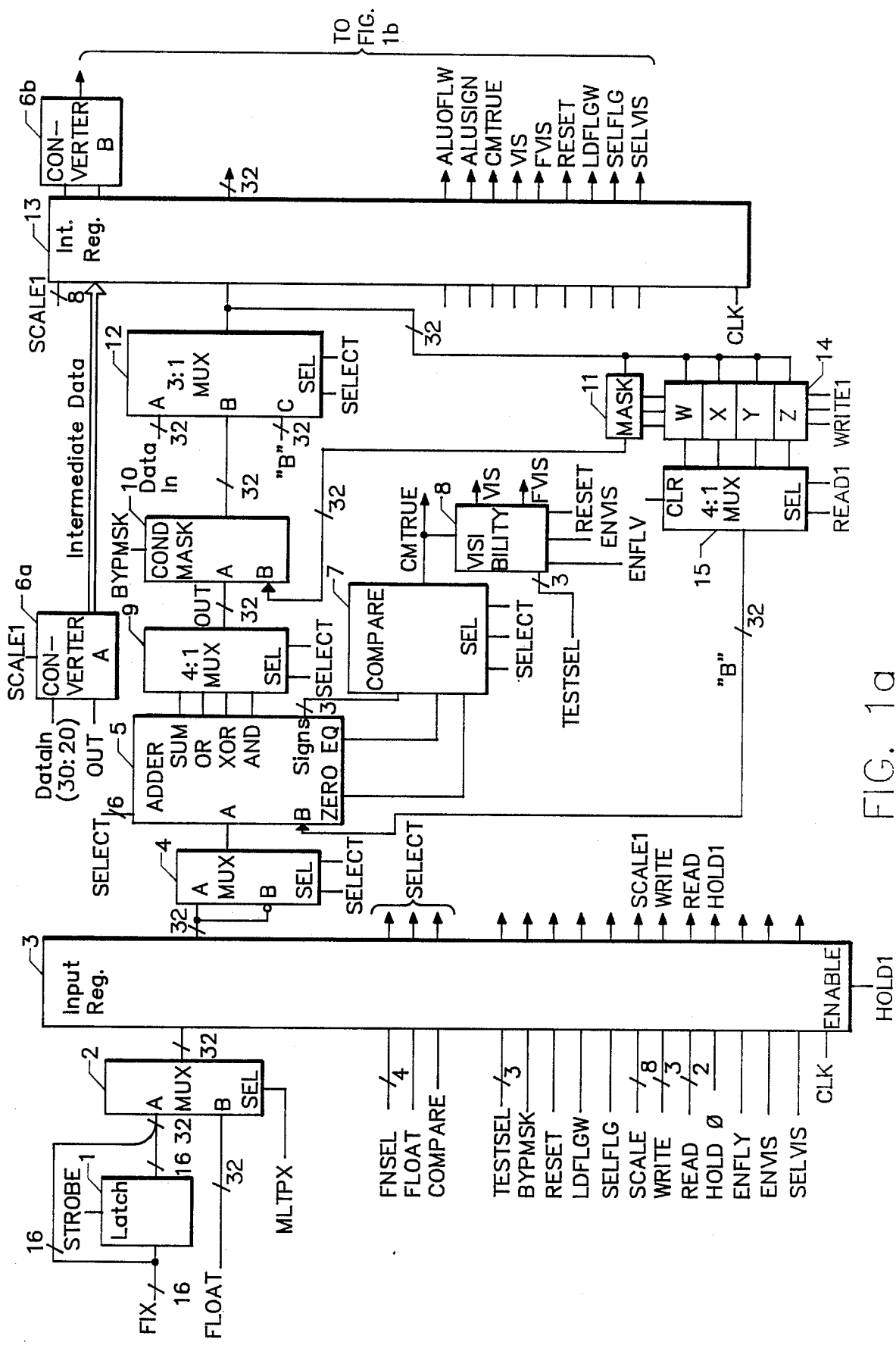
FIGS. 1a and 1b are general block diagrams of the multifunction arithmetic logic circuit.

The present invention in its preferred embodiment comprises a single integrated circuit having four interrelated sections. These are an input section, an arithmetic logic unit ("ALU") section, a shifter section, and an output section.

The input section receives 83 input signals comprising data and control signals. Forty-eight input signal lines are used to receive the data input to the circuit, either 32 bits at one time, or 16 bits at one time in a time multiplexed fashion. All input signals are temporarily stored in an input register during the same clock period.

The ALU section of the circuit is centered around a 32-bit fixed point ALU subcircuit. The input data to the multifunction circuit always enters the ALU subcircuit as the "A" input. A "B" input value used by the ALU subcircuit is chosen from one of four internal registers by means of a clearable multiplexer. Any of these four internal registers, as well as a mask register, may be written to from the ALU subcircuit output. The mask register may be used to clear certain bits from the output of the ALU subcircuit.

Also contained within the ALU section is a compare subcircuit that permits comparison of the "A" and "B" values, a visibility logic subcircuit used to determine if an object is visible for graphics applications, and a conversion subcircuit used to convert numbers from a twos' complement, fixed point number representation to the proposed IEEE 32-bit floating point number representation, and vice versa.

The shifter section of the multifunction circuit receives inputs from a register which follows the ALU section (not to be confused with the four internal registers which select the "B" input or with the mask register). The input to the shifter circuit from the ALU section may be selectively shifted left or right as determined by a shift code, which can be set by the user as an input to the multifunction circuit, or which is derived from the conversion section when converting number representations.

The output from the shifter feeds into a multiplexer and into a flag register, the output of which is also coupled to the multiplexer. The flag register allows the output of the shifter to be stored and combined with other outputs to pack data or create flag words. The multiplexer chooses whether the flag register data or the shifter output is coupled to the output section.

The last stage of the pipelined architecture multifunction circuit is the output register. Thirty-five of the multifunction circuit's 36 outputs leave from this register (a visible flag signal VIS leaves one register bank earlier).

The multifunction circuit can operate on logical data as well as numbers represented in fixed or floating point numeric representations. When manipulating floating point numbers, the present invention uses the proposed IEEE standard floating point format, which consists of 23 bits of mantissa, 8 bits of exponent, and a sign bit. In this format, a binary point is understood to exist between bit positions 22 and 23. A floating point number is represented in one of the following ways:

1. If the exponent is nonzero, then:
   Number = $[(-1)^{(sign)} * 2^{(exponent-127)} * (1.\text{data})]$
2. If the exponent is zero, but the data is nonzero (indicating a denormalized number), then:
   Number = $[(-1)^{(sign)} * 2^{(-127)} * (0.\text{data})]$
3. If both the exponent and the data are zero, then:
   Number = 0.0
4. If the exponent is $FF_{16}$ and the mantissa is zero, then:
   Number is considered to be: (+ or −) infinity.
5. If the number is $FF_{16}$ and the mantissa is nonzero, then:
   Number is considered to be: not a number.

In order to simplify the circuitry of the present invention, a denormalized number is forced to zero, and any number with an exponent of $FF_{16}$ is forced to (+ or −) infinity, depending on the sign bit.

For fixed point numbers, the data is in twos' complement format. A binary point may be assumed to exist anywhere in a fixed point number. However, for mathematical functions, the "A" and "B" inputs are assumed to have the same binary point locations. Provision is made for manipulating the binary point location during conversions from one numeric format to another.

The multifunction circuit indicates fixed point overflow and underflow. Fixed point overflow can occur in one of two ways. A signal (ALUOFLW) output from the multifunction circuit indicates whether an overflow was caused by an adder function in the ALU subcircuit. The other source of overflow for fixed point data is from the shifter subcircuit. If the shifter subcircuit shifts a fixed point number to the left and leaves nothing but zeros, an overflow has occurred. The circuit does not flag this overflow, nor is the data altered.

Fixed point data underflow occurs when the shifter subcircuit shifts out all data bits which are different from the sign bit. The multifunction circuit in this case does clear the data and sign. Fixed point underflow and overflow in the shifter subcircuit can also occur during number conversions, and are treated in the same manner.

DETAILED DESCRIPTION

Figure 1B:
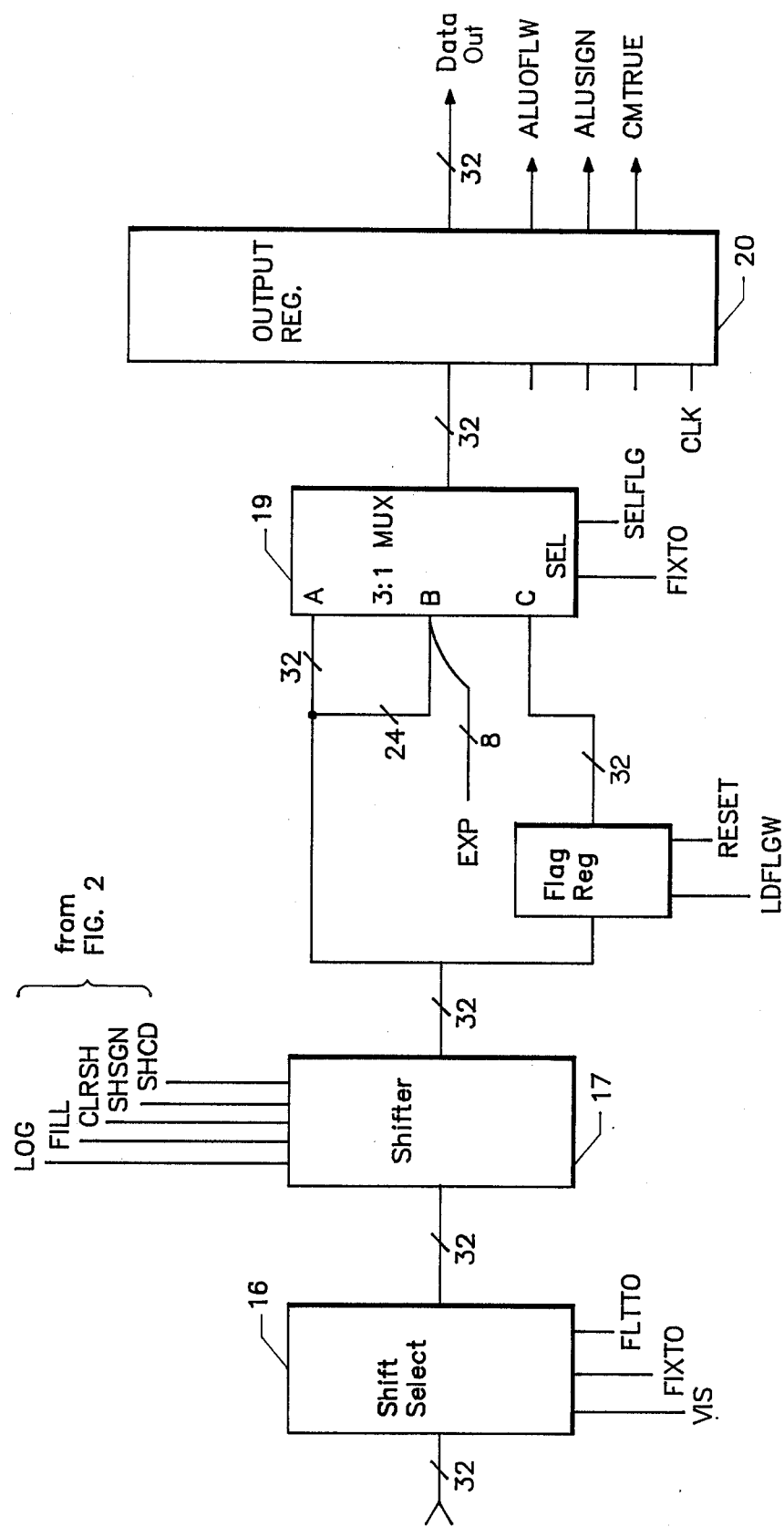

FIGS. 1a and 1b show a block diagram of the overall inventive multifunction arithmetic logic circuit. In the preferred embodiment of the inventive circuit, extra circuitry is added for the convenience of the end-user. The presence of such circuitry should not be taken as a limitation of the basic invention.

The preferred embodiment of the present invention has 83 input signal lines and 36 output signal lines. The input signal lines include a 32-bit bus for input data as well as a 16-bit time multiplexed bus for input data. A multiplexer select signal MLTPX determines which of the two input busses is selected.

An 8-bit SCALE input bus is also provided, the input of which is used to control the shifter section. Also, for a fixed to floating point number conversion, the SCALE input determines the exponent of the generated output. For a floating point to fixed point number conversion, the SCALE input is used as a base to make positioning of the binary point consistent and in a desired range.

Input control signals include the following:

WRITE—Three signals are provided to determine one of five internal registers to which the ALU subcircuit section will write data.

READ—Two signal lines are provided to select which of four internal registers are selected to provide data to the "B" input of the ALU subcircuit.

TESTSEL—Three signal lines determine which of six visibility tests are to be performed in the visibility logic subcircuit.

FLOAT—The FLOAT signal is used to indicate floating point number operations.

COMPARE—The COMPARE signal activates the compare mode. The "A" input is compared with a number stored in one of four internal registers of the circuit. If the compare operation is true, a value in an internal register (which may differ from the internal register used in the comparison) is passed through the first pipeline stage of the multifunction circuit. If the compare operation proves false, the "A" input value is passed through the first pipeline stage.

FNSEL—Four signals are used in conjunction with the FLOAT and COMPARE signals to select which function the multifunction arithmetic logic circuit performs. These six signals are decoded in various combinations to enable various circuitry as desired by the end-user.

ENFLV—This signal enables the "fully visible" test of the visibility logic subcircuit. It is used with the ENVIS signal to control what test is performed on particular input data.

ENVIS—This signal enables the "visible" test of the visibility logic subcircuit, and is used in conjunction with the ENFLV signal.

SELVIS—This signal selects the "Fully Visible" flag to be the input to the shifter subcircuit.

BYPMSK—This bypass signal is used to activate or deactivate the mask register, the contents of which may be used to mask off bits leaving the ALU subcircuit. This signal has no effect in the COMPARE mode or when selecting the visibility tests.

SELFLG—This signal selects the flag word as the output of the multifunction arithmetic logic circuit. The shifter section output is logically OR'd with the contents of the flag word register before the contents are output from the multifunction circuit.

LDFLGW—This signal loads the flag word register with the results of the existing flag word contents logically OR'd with the output of the shifter subcircuit.

RESET—This signal clears the flag word register, and sets the output of the visibility logic subcircuit as "Visible" and "Fully Visible".

HOLD—This signal holds data and control signals in the input register for the next clock cycle, ignoring any new inputs.

The output of the multifunction circuit includes a 32-bit wide bus comprising the generated output number or data. Additional outputs include the following signals:

ALUOFLW—This is an overflow signal from the ALU section, and is only meaningful when a fixed point number is added or subtracted within the ALU.

ALUSIGN—This is the sign of the data that actually left the ALU section before any other processing of the data may have altered it.

CMTRUE—This signal indicates that a COMPARE operation performed in the ALU section proved to be true.

VIS—This signal indicates that a series of comparison tests has shown that the input data, when representing a graphics object, is such that the object is visible within the graphic space selected by the user. This signal exits the circuit after only two clock delays rather than three clock delays (which is the case for all other output signals from the multifunction circuit).

FIGS. 1a and 1b show the overall architecture of the inventive multifunction arithmetic logic circuit. Data can be input either sixteen bits at a time over a set of signals lines denoted "FIX", or thirty-two bits at a time over a set of signal lines denoted "FLOAT". In the former case, during the first clock period sixteen bits of data are strobed into a latch 1, and during a next clock period, a second set of sixteen bits, along with the sixteen bits previously stored in the latch 1, are input through a 32-bit multiplexer 2 to an input register 3. In the latter case, all thirty-two bits are directly entered into the input register 3 through the multiplexer 2. The inputs to the multiplexer 2 are selected by the MLTPX signal. All of the other control inputs to the multifunction circuit are also temporarily stored in the input register 3.

The input register 3 may be disabled by the HOLD signal after the HOLD signal has first passed through the input register 3 on a previous clock cycle.

The ALU section has a simple block-style design that permits it to perform the following functions in the preferred embodiment:

| Data Type | Function |
|---|---|
| LOGICAL | SET |
| LOGICAL | RESET |
| LOGICAL | A |
| LOGICAL | B |
| LOGICAL | A AND B |
| LOGICAL | A OR B |
| LOGICAL | A XOR B |
| LOGICAL | NOT(A) |
| FIXED | A |
| FIXED | −A |
| FIXED | ABS(A) |
| FIXED | B |
| FIXED | A + B |
| FIXED | −A + B |
| FIXED | A FIX-FLT |
| FIXED | A GT B |
| FIXED | A LE B |
| FIXED | A GE B |
| FIXED | A LT B |
| FIXED | A EQ B |
| FIXED | A NE B |
| FLOAT | A |
| FLOAT | B |
| FLOAT | ABS(A) |
| FLOAT | ABS(B) |
| FLOAT | A FLT-FIX |
| FLOAT | A GT B |
| FLOAT | A LE B |
| FLOAT | A GE B |
| FLOAT | A LT B |
| FLOAT | A EQ B |
| FLOAT | A NE B |
| FLOAT | −A GT B |
| FLOAT | −A LE B |
| FLOAT | −A GE B |
| FLOAT | −A LT B |
| FLOAT | −A EQ B |
| FLOAT | −A NE B |

Additional functions could be performed with the disclosed ALU architecture by increasing the number of function select control signal lines.

The entire ALU subcircuit of the ALU section is composed of six parts plus five internal registers. Of these six parts, four are multiplexers as shown in FIG. 1, the data input from the input register 3 is coupled to a setable/clearable selection multiplexer 4 which is in turn coupled to a carry look-ahead adder 5. The selection multiplexer 4, which is coupled to the decoded FNSEL function select signals, controls whether the data input into the adder 5 is left unchanged, is inverted, is set all to zeros, or is set all to ones. The output of the selection multiplexer 4 is then coupled to the adder. The adder generates four natural outputs, comprising the sum of the two input numbers (A and B), the EXCLUSIVE OR logical operation on the two inputs, the logical OR operation on the two inputs, and the logical AND operation on the two inputs. Such carry look-ahead adders are well known in the prior art. These four outputs are coupled to a 4-to-1 multiplexer 9, which is controlled by the FNSEL function select signals. The output of the 4-to-1 multiplexer 9 is coupled to a conditional mask circuit 10, which logically AND's the output of the multiplexer 9 with the contents of a MASK register 11, unless the bypass mask mode is selected by the BYPMSK signal. If the bypass mask mode is selected, the output from the multiplexer 9 is simply fed forward through the conditional mask circuit 10 to a 3-to-1 multiplexer 12. The other inputs to the the 3-to-1 multiplexer 12 are the original data input into the multifunction circuit, and the output of one of four internal registers in an internal register bank 14. The output of the 3-to-1 multiplexer 12 is coupled to an intermediate register 13, to a bank of four internal registers (denoted as W, X, Y, and Z) comprising the register bank 14, and to the MASK register 11. The W, X, Y, and Z registers are used to store intermediate values, while the MASK register 11 is used to store a masking data pattern. The WRITE signals control which of the registers in the register bank 14 and the MASK register 11 will store the output from the multiplexer 12. The outputs of the register bank 14 are coupled to a 4-to-1 clearable multiplexer 15, the output of which is selected by the READ signals. The output of the multiplexer 15 is coupled to the "B" input of the adder circuit 5, and to the "C" input of the 3-to-1 multiplexer 12.

With the above configuration, data can be input to the multifunction circuit, operated on by the ALU subcircuit, and stored either in the MASK register 11 or in the register bank 14. In this later case, any register in the register bank 14 may be used as the "B" input to the adder circuit 5. The circuit shown thus can perform addition, subtraction, and logical operations on input data or on intermediate stored data.

The data stored in the intermediate register 13 is coupled to a shift select circuit 16, which performs two functions. The first function is a clamping function, which clamps a floating point number to zero if the exponent of the number is zero, and clamps a floating point number to (+ or −) infinity if the exponent is equal to $FF_{16}$. The shift select circuit also generates high order fill bits for a floating point number, to fill out the mantissa (which is only twenty-three bits long) to a full thirty-two bits. The fill bits are equal to "zero" if the input floating point number is positive, and to "one" if the input number is negative. Fixed point numbers and logical data are passed through the shift select circuit 16 unchanged.

The output of the shift select circuit 16 is coupled to a left-right shifter circuit 17. The amount of a shift performed by the shifter 17 is controlled by a five-bit shift code SHCD, while the direction of the shift is controlled by a shift sign signal SHSGN. In addition, a FILL signal is used in conjunction with fixed-point data to indicate either a zero or a one as the fill bit when shifting.

The output of the shifter 17 is coupled to a flag register 18, and a 3-to-1 multiplexer 19. The output of the flag register 18 is coupled to another input of the 3-to-1 multiplexer 19. The third input to the 3-to-1 multiplexer 19 comprises the exponent signal EXP derived from the conversion subcircuit (described below with respect to FIG. 2), the sign bit from the shifter 17 output, and bits 8 through 30 from the shifter 17 output. The last configuration permits conversion of fixed point numbers to floating point numbers, with a shift being performed in the shifter 17 of the bits that will ultimately form the mantissa of the output floating point number, while the exponent of the output floating point number is calculated in the conversion subcircuit.

The output of the 3-to-1 multiplexer 19 is coupled to an output register 20, which also receives and temporarily stores an ALU overflow signal ALUOFLW, and an ALU sign signal ALUSIGN.

The flag register 18 is controlled by a reset signal RESET and a load flag word signal LDFLGW, which permit the clearing of the flag register 18, or the loading of the flag register with the output of the shifter 17. Multiple loads of the flag word register cause the prior contents of the flag word register to be logically OR'd with each new shifter 17 output. The output of the flag register 18 thus can be used to store and combine data in order to pack data or create flag words for use outside of the multifunction circuit.

Figure 2:
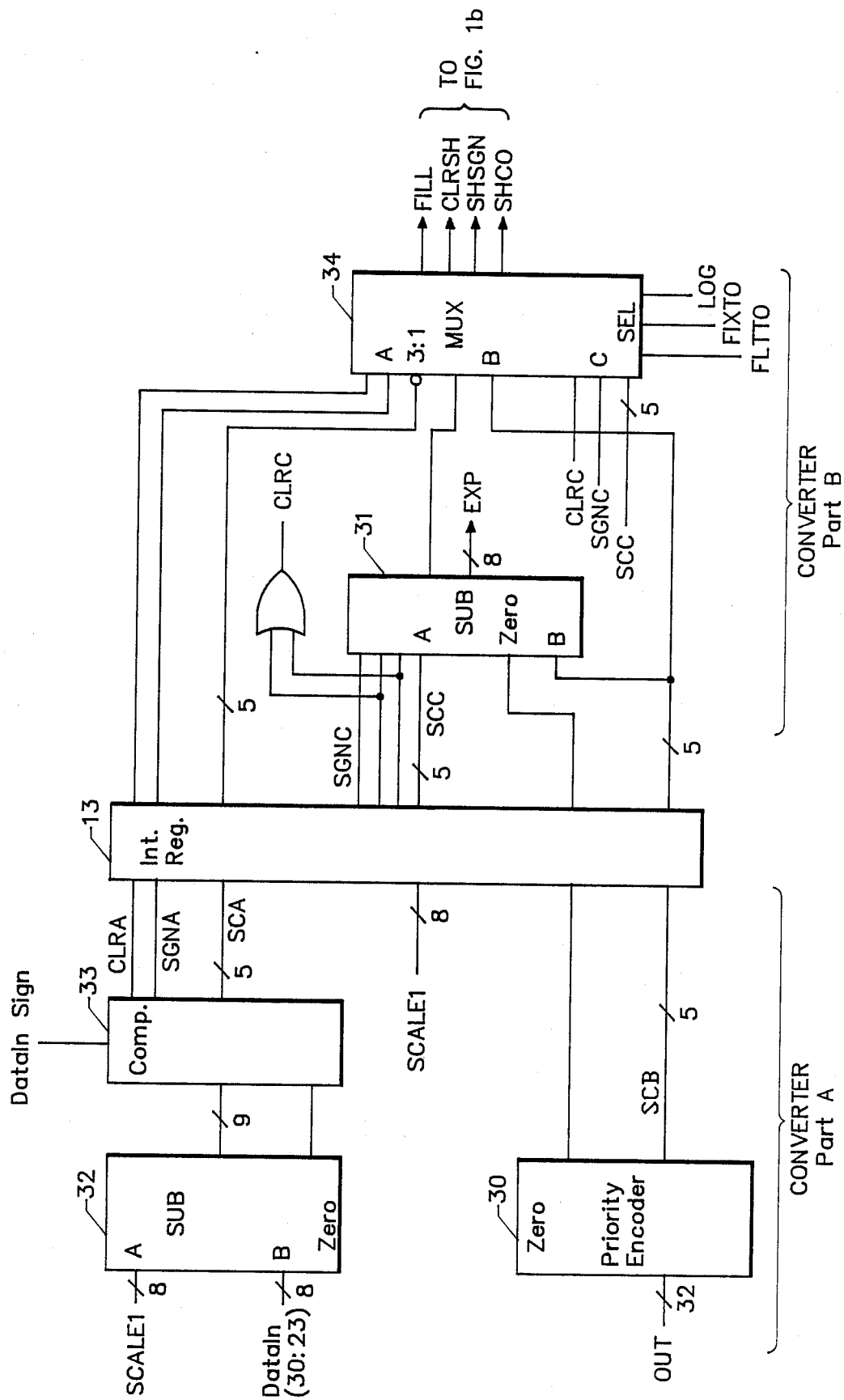
FIG. 2 is a simplified block diagram of the conversion subcircuit of the invention.

Part of the ALU section and shifter section is a converter circuit 6a, 6b, shown in greater detail in FIG. 2. This circuit has two pipelined sections. The first section converts a number from fixed point representation to floating point representation The second section converts a number from floating point representation to fixed point representation.

To convert a number from fixed point representation to floating point representation, an exponent input is required as a starting point That exponent is then decreased to account for leading zeros in the fixed point number. The fixed-point number to be converted is first coupled to the adder 5 shown in FIG. 1a, and converted to a signed magnitude format in the adder circuit. This is done by taking the twos' complement of the input number if it is negative. The signed magnitude result is then fed from the output of the adder 5 into a priority encoder circuit 30 shown in FIG. 2. This circuit, which is well known in the prior art, determines the number of leading zeros in the input number. The output of the priority encoder 30 is a fixed-point shift code SCB, which is temporarily stored in the intermediate register 13, along with the output of the ALU subcircuit (comprising the twos' complement form of the input number). The SCALE input is used as a starting exponent and is also stored in the intermediate register as a scale shift code SCC. Bits 5 and 6 of the SCALE input are OR'd to form a clear signal CLRC which can be used to clear the shifter 17. The fixed-point shift code SCB and the scale shift code SCC from the intermediate register 13 are coupled to a subtraction circuit 31, the output of which is a clear signal CLRB which can be used to clear the shifter 17, and a new exponent signal EXP which is coupled to the 3-to-1 multiplexer 19 shown in FIG. 1b. The fixed-point shift code SCB and the scale shift code SCC are also directly coupled to a shift code select multiplexer 34. The outputs of the select multiplexer 34 are coupled to the shifter 17 as control signals. The select multiplexer 34 is controlled by three signals derived from the function select signals FNSEL and FLOAT, and determine which shift code input to the select multiplexer 34 is coupled to the shifter 17.

In the fixed to floating point conversion mode, the fixed-point shift code SCB stored in the intermediate register 13 causes the shifter 17 to remove any leading zeros from the mantissa. The exponent EXP, calculated by taking the shift code output from the intermediate register 13 and subtracting it from the SCALE input by means of the subtraction circuit 31, is merged with the output of the shifter 17 in the 3-to-1 multiplexer 19 to form the proper floating point number.

Again referring to FIG. 2, to convert a number from floating point representation to fixed point representation, the SCALE input is used to align the binary point of the resulting output. The conversion requires that the mantissa of the floating point number be put into twos' complement form in the adder 5 (in the same manner as the twos' complement is taken for conversions from fixed point to floating point representation), and temporarily stored in the intermediate register 13. Simultaneously, bits 23 through 30 of the input number are subtracted from the SCALE input in a subtraction circuit 32 to scale the generated fixed point number to a desired range. The output of the subtraction circuit 32 is a twos' complement number, which is converted to a signed magnitude number by complement circuit 33 (which simply takes the twos' complement of the input number if it is negative). The resulting output is a floating-point shift code SCA. If the magnitude of the difference is greater than thirty-one, or if the exponent input from the subtraction circuit 32 is zero, a clear signal CLRA is generated which can be used to clear the shifter 17. The select multiplexer 34 then couples the floating-point shift code SCA to the shifter 17, and the shift select circuit 16 couples bit positions 0 through 22 of the twos' complement form of the input number to the shifter 17. The eight most significant bits of the shifter 17 input are set by the shift select circuit 16 to the same value as the sign of the input number. Bit position 23 is set to the value of the "hidden" bit inherent in the IEEE 32-bit floating point number representation format This is done by making that bit position a "one" if the input number was positive, and a "zero" if the input number was negative (unless all of the mantissa bits are zero, in which case the hidden bit number is set to "one", regardless of the sign of the input number). The input to the shifter 17 is shifted by the amount of the floating-point shift code SCA, thus completing the conversion. By adjusting the SCALE input, the user may "position" an implied binary point anywhere in the output number.

When the multifunction arithmetic logic circuit has not been placed into the conversion mode, the SCALE input can directly control the shifter 17 by selecting the scale shift code SCC input to the selection multiplexer 34. The SCALE input is entered in a signed magnitude format. A shift code SCC greater than "31" causes the shifter 17 to shift its input completely out, effectively clearing the shifter. A negative SCALE input shifts a number left, a positive SCALE input shifts a number right. For a left shift, the new bits shifted in on the right of the input number are always zeros. If the multifunction circuit output is going to be a fixed point result (resulting from any fixed point function or a floating point to fixed point conversion), the sign is preserved in left shifts and extended in right shifts. If the output is considered logical data, the most significant bit is freely shifted out on left shifts and zeros are shifted in on right shifts.

Also included in the ALU section is a compare subcircuit 7. This circuit allows numbers to be compared and sorted, and is also used in conjunction with a visibility subcircuit 8 (described below in conjunction with FIG. 4). The COMPARE function outputs a signal CMTRUE from the inventive circuit, as well as a data word based upon the outcome of the selected test. For example, if the ALU function "FIX A GT B" is true, the compare output signal CMTRUE is set to a logical "1", and the "B" input to the adder 5 is output from the multifunction arithmetic logic circuit. If the result were false, the CMTRUE signal would be set to a logical "0", and the "A" input would have been output from the multifunction circuit. To sort numbers then, this function would be run many times, with the result being continuously stored in one of the registers of the register bank 14. At the end of the test, the smallest data word of the numbers being sorted would be stored in the register bank 14. If desired, the input control signals to the multi-function circuit can be set so that a number stored in any of the registers of the register bank 14 is output depending upon the results of the comparison between the "A" and "B" inputs.

Figure 3:
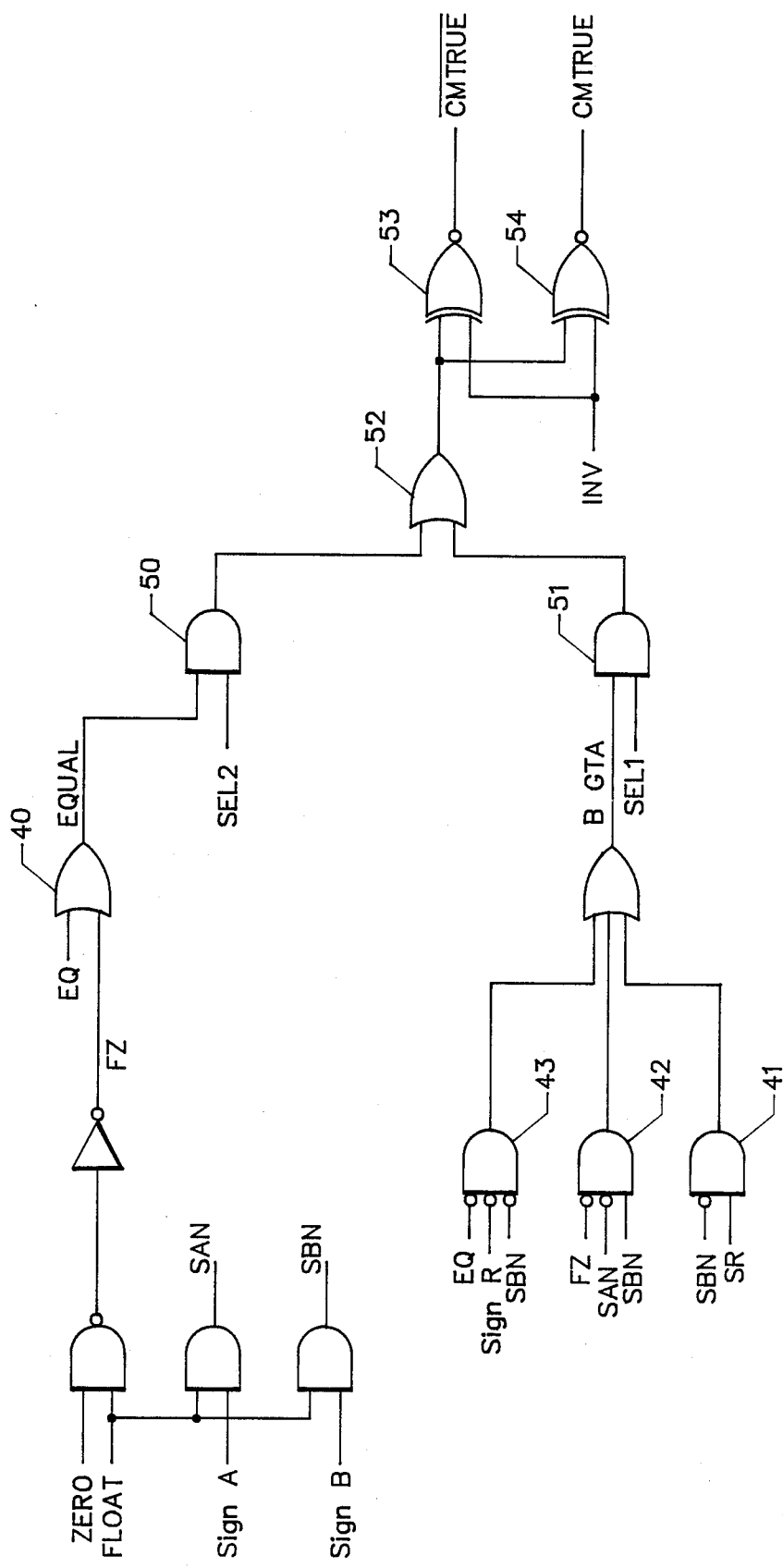
FIG. 3 is a simplified block diagram of the comparison subcircuit of the invention.

FIG. 3 shows a simplified schematic circuit of the compare subcircuit. Accommodation has been made to compare both fixed point numbers and floating point numbers. For fixed point data, the circuit uses the fact that the twos' complement number system is continuous, and therefore needs only to subtract the "A" input from the "B" input in the ALU circuit 5. If the result is negative, A must be larger than B. If the result is zero, A equals B. If neither of these results occur, then A is less than B. One of the outputs of the adder circuit 5 is a signal EQ indicating that the two input numbers were equal (which can be determined by logically EXCLUSIVE OR'ing the two input numbers together). Another output signal, ZERO, from the adder circuit 5 indicates whether either input number is considered to be equal to zero (that is, the exponent is equal to zero), which can be determined by logically OR'ing the exponents of the two input numbers. These two signals are input to the compare subcircuit 7.

For comparing fixed point data, one section of the circuit shown in FIG. 3 receives the equal signal EQ by means of an OR gate 40. If EQ is a "one", then the output signal of the OR gate 40, EQUAL, is a "one", indicating that the compared numbers are equal. If input "A" is greater than input "B", the output of an AND gate 41 is a "one", indicating that the sign SR of the result of "B−A" is negative. (The other input to AND gate 41 is always a "one" when non-floating point numbers are compared, as controlled by the FLOAT signal).

Two control signals, SEL1 and SEL2 (derived from the compare signal COMPARE, the FLOAT signal, and the function select signals FNSEL), in conjunction with two AND gates 50, 51 govern the coupling of the "equal" signal EQUAL and the "greater than" signal GT through an OR gate 52. If only the SEL1 signal is active, then the circuit determines whether "A" is greater than "B". If only the SEL2 signal is active, the circuit determines whether "A" equals "B". If both signals are active, the output of the OR gate 52 indicates whether "A" is greater than or equal to "B". The output of the OR gate 52 is coupled through an exclusive NOR gate 53 and an exclusive OR gate 54. A third control signal, INV, generates the result of the selected function, CMTRUE, as well as the inverse of the selected function. The remaining logical comparison functions (A less than or equal to B, A not equal to B, and A less than B) are generated by using the INV control signal, since these functions are the complement of the other three functions generated by the circuit as controlled by the SEL1 and SEL2 signals.

For floating point numbers, the number system is not bitwise continuous. Therefore, simply examining the sign of the difference, SR, is not sufficient. Therefore, when comparing floating point numbers (as indicated by the FLOAT signal), AND gates 41, 42, and 43 combine the sign of the remainder (SR), the sign of the "A" input (SAN), the sign of the "B" input (SBN), and the ZERO signal (FZ) to determine if "A" is greater than "B". Further, if the exponents of the two numbers are both zero, then the numbers are considered to be equal, as indicated by the FZ signal input to OR gate 40. The remainder of the circuit functions in the same manner as when fixed point numbers are compared.

Figure 4:
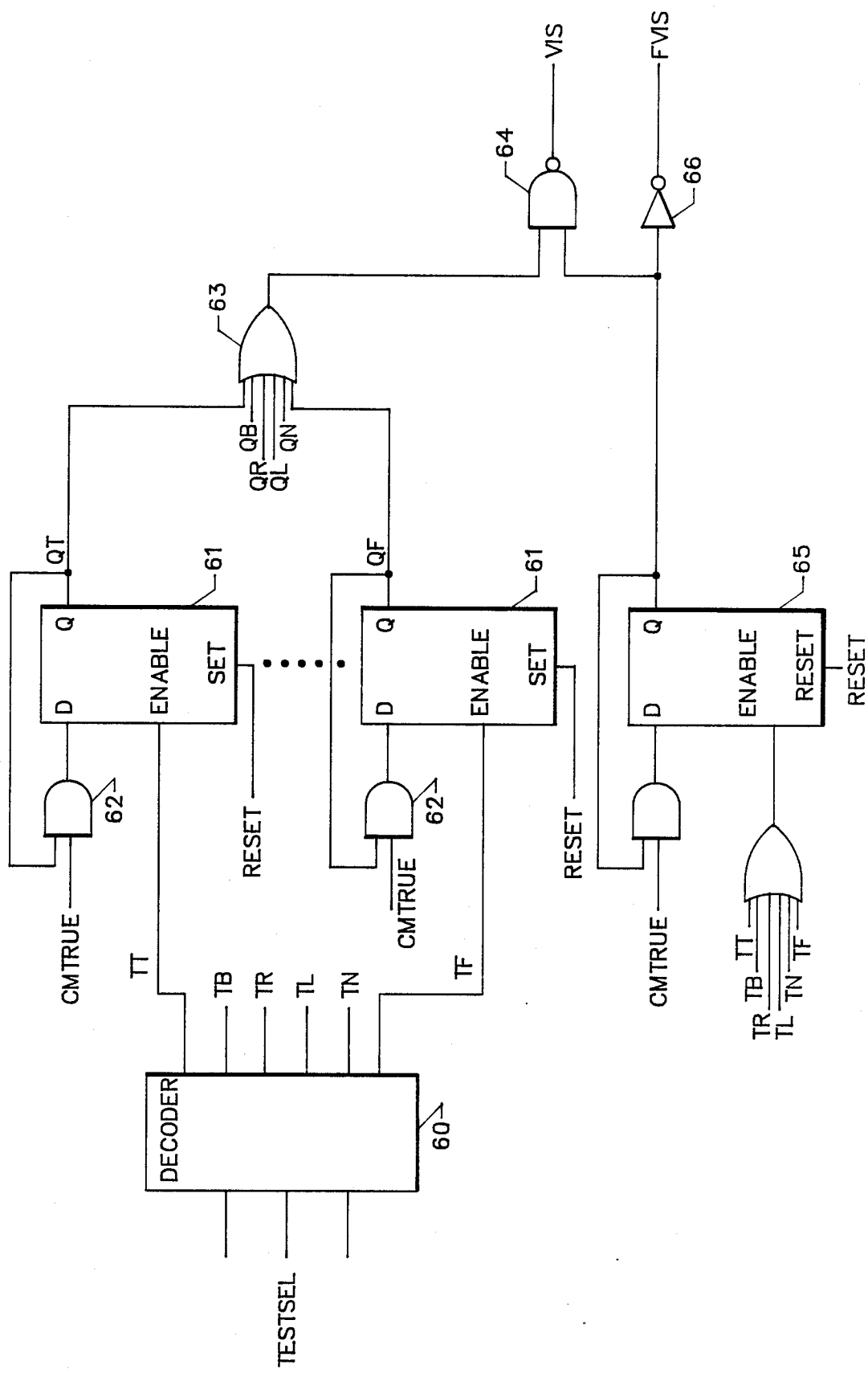
FIG. 4 is a simplified block diagram of the visibility logic subcircuit of the present invention.

Also included in the ALU section is a visibility logic subcircuit 8, shown in detail in FIG. 4. In graphics usage, visibility refers to the assumption that a field of view is defined by six bounding planes (near, far, left, right, top, bottom), with the Cartesean coordinant origin understood to be inside the bounded area (typically at the center). A graphics image is typically constructed from a set of polygons. A polygon may be considered to be defined by a set of numbers. In a graphics environment, to test whether a polygon is within a selected field of view, all points defining the polygon must be tested to see whether they are greater than or less than the six planes which define the field of view. In the present embodiment, the points of a polygon are individually tested against all six planes in a selected order. As a result of such testing, a polygon may fall within three categories: fully visible (that is, all points of the polygon are within the field of view), not fully visible (at least some of the points of the polygon fall outside of the field of view), and invisible (all of the points of the polygon fall outside of the field of view).

The circuit in FIG. 4 performs these tests. For the visibility test, the particular test to be performed is set by means of the TESTSEL signal lines, which are coupled to a decoder 60. The decoder output selects one of six "D" flipflops 61, each initially set to a logical "one", the input of which comprises its own output coupled through an AND gate 62, the other input of which is the CMTRUE output of the compare subcircuit 7 (shown in FIG. 3). In effect, for each test, a flipflop 61 tracks and latches any change in the comparison test. Thus, a number representing a point in the polygon is compared in the compare subcircuit 7 with a second number representing the appropriate coordinate of a bounding plane. The polygon point is sequentially tested against each bounding plane (six tests), and if the CMTRUE signal for the particular bounding plane is "false", the output of the associated flipflop 61 is latched (by means of the feedback through its AND gate 62) to a logical "zero," indicating that the tested polygon point is inside of the testing plane (and hence possibly visible). The test results of all six flipflips 61 are coupled to an OR gate 63, the output of which is coupled to a NAND gate 64. If all of the six flipflips 61 change to a logical zero, then part of the polygon is within the field of view, as indicated by the VIS signal. The VIS signal is temporarily stored in the intermediate register 13, and is output from the multifunction circuit in the next clock cycle.

The last portion of the visibility logic subcircuit is another "D" flipflop 65, the output of which is initially set to a logical "zero". This flipflop 65 is enabled whenever any of the six bounding plane tests are being performed. The output of the fully visible flipflop 65 is set and latched to a logical "one" state if any of the CMTRUE signals is "true" (indicating that at least one point of the polygon is outside the field of view). The output of the fully visible flipflop 65 is also coupled to NAND gate 64, and to an inverter 66, the output of which is a "fully visible" signal FVIS. As long as the output of the fully visible flipflop 65 is a logical zero, the object is considered to be "fully visible" and "visible."

By appropriate use of the test result signals VIS and FVIS, any polygon can be tested as to whether it is fully visible, not fully visible, or invisible.

While this invention had been described with reference to a preferred embodiment, it is not intended that this description be construed in a limiting sense. Various modifications of the preferred embodiment as well as other embodiments of the invention, will be apparent to persons skilled in the art upon reference to this description. For example, the basic inventive circuit could be readily adapted to a non-pipelined architecture. It is therefore contemplated that the appended claims will cover any modifications or embodiments as fall within the true scope of the invention.

We claim:

1. A multifunction arithmetic logic circuit having a modular arithmetic logic circuit, the modular arithmetic logic circuit including:
    a. an adder circuit for operating on an input number and a previously stored output number, and generating and outputting the sum, logical OR, logical AND, and logical EXCLUSIVE OR thereof;
    b. an adder selection multiplexer coupled to the adder circuit for selectively outputting one of the adder circuit outputs; and
    c. a multiple register and selector means coupled to the adder selection multiplexer and the adder circuit, for temporarily storing at least one output number of the adder selector multiplexer and for selectively coupling a stored output number to the adder circuit.

2. The multifunction arithmetic logic circuit of claim 1, further including an input multiplexer coupled to the adder circuit, for selectively outputting the input number or the inverse of the input number to the adder circuit.

3. The multifunction arithmetic logic circuit of claim 1, further including a conditional mask circuit coupled to and between the adder selection multiplexer and the multiple register and selection means, for selectively logically AND'ing and outputting the output of the adder selection multiplexer an a number from the multiple register and selection means.

4. The multifunction arithmetic logic circuit of claim 1, wherein the multiple register and selection means comprises a register bank and a multiplexer.

5. A multifunction arithmetic logic circuit having a modular arithmetic logic circuit, the modular arithmetic logic circuit including:
    a. an input multiplexer for selectively outputting an input number or the inverse of the input number;
    b. an adder circuit for operating on the input number and a previously stored output number, and generating and outputting the sum, logical OR, logical AND, and logical EXCLUSIVE OR thereof;
    c. an adder selection multiplexer coupled to the adder circuit for selectively outputting one of the adder circuit outputs;
    d. a multiple register and selector means coupled to the adder selection multiplexer and the adder circuit, for temporarily storing at least one output number of the adder selector multiplexer and for selectively coupling a stored output number to the adder circuit; and
    e. a conditional mask circuit coupled to and between the adder selection multiplexer and the multiple register and selection means, for selectively logically AND'ing and outputting the output of the adder selection multiplexer and a number from the multiple register and selection means.

6. The multifunction arithmetic logic circuit of claim 5, further including a fixed-point number and floating-point number comparison circuit coupled to the adder circuit, wherein the adder circuit generates and outputs signals indicative of the signs of two numbers input into the adder circuit, the sign of the difference of the two numbers, and the equality of the two numbers, and the comparison circuit selectively compares the adder inputs and outputs a signal indicative of the equality of the two numbers, whether one number is greater than the other number, or whether one number is greater than or equal to the other number.

7. The multifunction arithmetic logic circuit of claim 6, wherein the comparison circuit further selectively outputs a signal indicative of the inverse of the selected output comparison.

8. The multifunction arithmetic logic circuit of claim 5, further including a visibility circuit means coupled to the comparison circuit, for sequentially testing a series of comparison circuit outputs, and indicating a change in the output of any of the series of comparisons and a change in the output of all of the comparisons.

9. The multifunction arithmetic logic circuit of claim 8, wherein the means for testing and indicating a change in the output of any of the series of comparisons comprises a latch.

10. The multifunction arithmetic logic circuit of claim 8, wherein the means for testing and indicating a change in the output of all of the comparisons comprises a multiplicity of latches, one for each comparison in the tested series, the outputs of the latches being coupled to a logical OR gate.

11. A pipelined architecture, multifunction arithmetic logic circuit, the circuit including:
    a. an input pipeline circuit for receiving and temporarily storing an input number and control commands;
    b. a modular arithmetic logic circuit including:
        (1) an adder circuit coupled to the output of the input circuit, for operating on the input number and a previously stored output number, and generating and outputting the sum, logical OR, logical AND, and logical EXCLUSIVE OR thereof;
        (2) an adder selection multiplexer coupled to the adder circuit for selectively outputting one of the adder circuit outputs;
        (3) a multiple register and selector means coupled to the adder selection multiplexer and the adder circuit, for temporarily storing at least one output number of the adder selector multiplexer and for selectively coupling a stored output number to the adder circuit; and
    c. an output pipeline circuit coupled to the output of the modular arithmetic logic circuit, for receiving and temporarily storing the output of that circuit.

12. The multifunction arithmetic logic circuit of claim 11, further including an input multiplexer coupled to and between the input circuit and the adder circuit, for selectively outputting the input number or the inverse of the input number to the adder circuit.

13. The multifunction arithmetic logic circuit of claim 11, further including a conditional mask circuit coupled to and between the adder selection multiplexer and the multiple register and selection means, for selectively logically AND'ing and outputting the output of the adder selection multiplexer and a number from the multiple register and selection means.

14. The multifunction arithmetic logic circuit of claim 11, wherein the multiple register and selection means comprises a register bank and a multiplexer.

15. A pipelined architecture, multifunction arithmetic logic circuit, the circuit including:
 a. an input pipeline circuit for receiving and temporarily storing an input number and control commands;
 b. a modular arithmetic logic circuit including:
  (1) an adder circuit coupled to the output of the input circuit, for operating on the input number and a previously stored output number, and generating and outputting the sum, logical OR, logical AND, and logical EXCLUSIVE OR thereof;
  (2) an adder selection multiplexer coupled to the adder circuit for selectively outputing one of the adder outputs;
  (3) a multiple register and selector means coupled to the adder selection multiplexer and the adder, for temporarily storing at least one output number of the adder selector multiplexer and for selectively coupling a stored output number to the adder circuit;
 c. an intermediate pipeline circuit coupled to the output of the modular arithmetic logic circuit, for receiving and temporarily storing the output of that circuit;
 d. a shifter circuit coupled to the output of the intermediate pipeline circuit, for selectively shifting the output of the modular arithmetic logic circuit; and
 e. an output pipeline circuit coupled to the output of the shifter circuit, for receiving and temporarily storing the output of that circuit.

16. The multifunction arithmetic logic circuit of claim 15, wherein the shifter circuit further includes a shift select means for directing selected bits of a floating-point number to selected inputs of a shift circuit.

17. The multifunction arithmetic logic circuit of claim 16, wherein the shifter circuit further includes:
 a. a flag register coupled to the shift circuit for cumulatively logically OR'ing the output of the shift circuit; and
 b. an output multiplexer coupled to the shift circuit and the flag register for selecting and outputting one of the outputs thereof.

18. The multifunction arithmetic logic circuit of claim 15, further including a numeric conversion circuit means for converting floating-point numbers to fixed-point numbers, comprising:
 a. a subtraction circuit coupled to the exponent bits of an input floating point number and to a selected scale input, for determining the difference between the exponent and the scale input; and
 b. a conditional twos' complement conversion circuit, coupled to the output of the subtraction circuit and to the intermediate pipeline stage, for converting a negative difference to twos' complement form, thereby generating a shift code;
 c. wherein the shift code is coupled to the shifter circuit, for controlling the direction and amount of shift of the input floating-point number, thereby generating the desired fixed-point number.

19. The multifunction arithmetic logic circuit of claim 15, further including a numeric conversion circuit means for converting fixed-point numbers to floating-point numbers, comprising:
 a. a priority encoder circuit, coupled to the output of the adder circuit and to the intermediate pipeline circuit, for determining the number of leading zeros in an input fixed-point number, thereby generating a shift code; and
 b. a subtraction circuit coupled to the shift code and to a selected scale input, for determining the difference between the shift code and the scale input, that difference comprising an exponent for the converted number;
 c. wherein the shift code is coupled to the shifter circuit, for controlling the direction and amount of shift of the input fixed-point number, and wherein the generated exponent and the shifted input number are combined to form the desired floating-point number.

20. A pipelined architecture, multifunction arithmetic logic circuit, the circuit including:
 a. an input pipeline circuit for receiving and temporarily storing an input number and control commands;
 b. a modular arithmetic logic circuit including:
  (1) an input multiplexer coupled to the output of the input circuit, for selectively outputting the input number or the inverse of the input number;
  (2) an adder circuit coupled to the input multiplexer, for operating on the input number and a previously stored output number, and generating and outputting the sum, logical OR, logical AND, and logical EXCLUSIVE OR thereof;
  (3) and adder selection multiplexer coupled to the adder circuit for selectively outputting one of the adder outputs;
  (4) a multiple register and selector means coupled to the adder selection multiplexer and the adder, for temporarily storing at least one output number of the adder selector multiplexer and for selectively coupling a stored output number to the adder circuit;
  (5) a conditional mask circuit coupled to and between the adder selection multiplexer and the multiple register and selection means, for selectively logically AND'ing and outputting the output of the adder selection multiplexer and a number from the multiple register and selection means;
 c. an intermediate pipeline circuit coupled to the output of the modular arithmetic logic circuit, for receiving and temporarily storing the output of that circuit;
 d. a shifter circuit coupled to the output of the intermediate pipeline circuit, for selectively shifting the output of the modular arithmetic logic circuit, said shifter circuit including:
  (1) a shift select means for directing selected bits of a floating-point number to selected inputs of a shift circuit;
  (2) a flag register coupled to the shift circuit for commutatively logically OR'ing the output of the shift circuit; and
  (3) an output multiplexer coupled to the shift circuit and the flag register for selecting and outputting one of the outputs thereof; and
 e. an output pipeline circuit coupled to the output of the shifter circuit, for receiving and temporarily storing the output of that circuit.

21. The multifunction arithmetic logic circuit of claim 20, further including a fixed-point number and floating-point number comparison circuit coupled to the adder circuit, wherein the adder circuit generates and outputs signals indicative of the signs of two numbers input into the adder circuit, the sign of the difference of the two numbers, and the equality of the two numbers, and the comparison circuit selectively compares the adder inputs and outputs a signal indicative of the equality of the two numbers, whether one number is greater than the other number, or whether one number is greater than or equal to the other number.

22. The multifunction arithmetic logic circuit of claim 21, wherein the comparison circuit further selectively outputs a signal indicative of the inverse of the selected output comparison.

23. The multifunction arithmetic logic circuit of claim 20, further including a visibility circuit means coupled to the comparison circuit, for sequentially testing a series of comparison circuit outputs, and indicating a change in the output of any of the series of comparisons and a change in the output of all of the comparisons.

24. The multifunction arithmetic logic circuit of claim 23, wherein the means for testing and indicating a change in the output of any of the series of comparisons comprises a latch.

25. The multifunction arithmetic logic circuit of claim 23, wherein the means for testing and indicating a change in the output of all of the comparisons comprises a multiplicity of latches, one for each comparison in the tested series, the outputs of the latches being coupled to a logical OR gate.

26. The multifunction arithmetic logic circuit of claim 20, further including a numeric conversion circuit means for converting floating-point numbers to fixed-point numbers, comprising:
 a. a subtraction circuit coupled to the exponent bits of an input floating point number and to a selected scale input, for determining the difference between the exponent and the scale input; and
 b. a conditional twos' complement conversion circuit, coupled to the output of the subtraction circuit and to the intermediate pipeline circuit, for converting a negative difference to twos' complement form, thereby generating a shift code;
 c. wherein the shift code is coupled to the shifter circuit, for controlling the direction and amount of shift of the input floating-point number, thereby generating the desired fixed-point number.

27. The multifunction arithmetic logic circuit of claim 20, further including a numeric conversion circuit means for converting fixed-point numbers to floating-point numbers, comprising:
 a. a priority encoder circuit, coupled to the output of the adder circuit and to the intermediate pipeline circuit, for determining the number of leading zeros in an input fixed-point number, thereby generating a shift code; and
 b. a subtraction circuit coupled to the shift code and to a selected scale input, for determining the difference between the shift code and the scale input, that difference comprising an exponent for the converted number;
 c. wherein the shift code is coupled to the shifter circuit, for controlling the direction and amount of shift of the input fixed-point number, and wherein the generated exponent and the shifted input number are combined in the output multiplexer to form the desired floating-point number.

* * * * *